(12) United States Patent
Tanaka et al.

(10) Patent No.: US 7,709,829 B2
(45) Date of Patent: May 4, 2010

(54) ORGANIC SEMICONDUCTOR MATERIAL, ORGANIC TRANSISTOR, FIELD EFFECT TRANSISTOR, SWITCHING DEVICE AND THIAZOLE COMPOUND

(75) Inventors: Tatsuo Tanaka, Sagamihara (JP); Hiroshi Kita, Hachioji (JP); Katsura Hirai, Hachioji (JP); Chiyoko Takemura, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 678 days.

(21) Appl. No.: 10/586,793

(22) PCT Filed: Jan. 14, 2005

(86) PCT No.: PCT/JP2005/000371

§ 371 (c)(1), (2), (4) Date: Jul. 20, 2006

(87) PCT Pub. No.: WO2005/070994

PCT Pub. Date: Aug. 4, 2005

(65) Prior Publication Data

US 2008/0251784 A1   Oct. 16, 2008

(30) Foreign Application Priority Data

Jan. 26, 2004   (JP)   ............... 2004-016905

(51) Int. Cl.
*H01L 35/24* (2006.01)
*H01L 51/00* (2006.01)
(52) U.S. Cl. ............... 257/40; 257/E51.001

(58) Field of Classification Search ............... 257/40
See application file for complete search history.

(56) References Cited

U.S. PATENT DOCUMENTS

2003/0235713 A1* 12/2003 Suzuki et al. ............... 428/690

FOREIGN PATENT DOCUMENTS

| JP | 09077854 A | * | 3/1997 |
| JP | 2003077671 A | * | 3/2003 |
| JP | 2004282039 A | * | 10/2004 |

OTHER PUBLICATIONS

Ng et al, "Molecular Diodes Based on Conjugated Diblock Co-oligomers," J. Am. Chem. Soc. 2002, 124, 11862-11863.*

* cited by examiner

*Primary Examiner*—Kenneth A Parker
*Assistant Examiner*—Anthony Ho
(74) *Attorney, Agent, or Firm*—Cantor Colburn LLP

(57) ABSTRACT

An organic semiconductor material comprising a compound having a substructure represented by Formula (10):

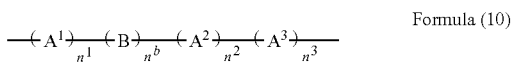

Formula (10)

wherein B represents a unit having a thiazole ring, $A^1$ and $A^2$ each independently represent a unit having an alkyl group as a substituent, $A^3$ represents a divalent linking group, $n^b$ represents an integer 1-20, $n^1$ and $n^2$ each independently represent an integer of 0-20, respectively, and $n^3$ represents an integer of 0-10.

8 Claims, 1 Drawing Sheet

ORGANIC SEMICONDUCTOR MATERIAL, ORGANIC TRANSISTOR, FIELD EFFECT TRANSISTOR, SWITCHING DEVICE AND THIAZOLE COMPOUND

TECHNICAL FIELD

The present invention relates to an organic semiconductor material, an organic transistor and a field effect transistor using the material and a switching element using the organic transistor or the field effect transistor.

BACKGROUND

Needs for flat panel display to be used for a display of a computer has been increased accompanied with spreading of information terminals. Moreover, chances of providing information by electronics media are increased, which have been provided hitherto by paper media, accompanied with progress of the information systems, and needs for electronic paper or digital paper to be used as thin and easily portable mobile displaying media have also been increased.

In the flat panel displays, the displaying media have been generally formed by using an element such as a liquid crystal, an organic EL or an element utilizing electrophoresis. In such a displaying media, technology using an active type driving element (TFT element) as the image driving element forms main stream for holding the brightness uniformity of the image and the image rewriting rate. For example, the TFT elements are formed on a glass substrate and sealed together with liquid crystals and organic EL elements in usual computer displays.

In such the case, semiconductors such as a-silicon (amorphous silicon) and p-Si (polysilicon) can be used. The TFT element can be produced by forming a source, drain and gate electrodes on a substrate by forming piled layers of such the silicon semiconductors and a metal layer according to necessity. A vacuum production process such as spattering apparatus is usually necessary for producing such the TFT element.

For producing such the TFT element, the vacuum production processing using a vacuum chamber should be repeated several times for forming each of the layers so that the costs for the equipment and running thereof become enormous. For example, repeating for several times of processes such as spattering, CVD, photo-lithographing, etching and washing is necessary in usual for producing the TFT element, and the element is formed on the substrate through several tens processes. In such the production method using the Si semiconductor, a considerable design change in the production equipment such as the vacuum chamber is necessary for responding to the requirement for large size display so that the change in the equipment can not be easily performed.

Moreover, the material of the substrate is limited to one capable of withstanding to the temperature in the process since a process to be carried out at high temperature is included in the usual TFT producing processes using the Si material. Therefore, glass should be actually used for the substrate. When the thin type display such as the electronic paper or the digital paper is constituted by such the usual TFT elements, the display becomes heavy and loses softness resulting in becoming breakable by the shock of falling. Such the properties caused by producing the TFT elements on the glass plate is not desirable for satisfying the needs of the easily portable thin display accompanied with the progress of the information system.

On the other hand, investigation on organic semiconductor materials having high electric charge transportat ability is aggressively progressed in recent years. Such the compound is expected to apply, for example, for organic laser oscillation element such as that discussed in Non-patent Document 1, and organic thin film transistor reported in Non-patent Document 2 and other reports, additionally to the electric charge transportation material for organic EL elements. When such the organic devices are realized, it is considered that the production process can be simplified by applying vapor deposition at relatively low temperature under vacuum or low pressure and a soluble semiconductor material can be produced by suitably modifying the molecular structure. Furthermore, production of the organic element by printing method including an ink-jet method becomes possible if the organic semiconductor solution can be prepared. Though it has been considered hitherto that such the production process at low temperature can not be applied for usual Si type semiconductor material, there is possibility of that the process can be applied to the device using the organic semiconductor material. Consequently, the limitation relating to the heat resistivity of the substrate is alleviated so that the TFT element can be formed on a transparent resin plate. If the TFT element can be formed on the transparent resin plate and a displaying material can be driven by the TFT element, a display having lighter weight and higher flexibility than those of the usual display and is hardly or very difficultly broken by falling may be obtained.

The organic semiconductor materials investigated for realizing such the TFT element have been limited to: an acene such as pentacene and tetracene (cf. Patent Document 1, for example); a phthalocyanine including lead phthalocyanine; a low molecular weight compound such as perylene and a tetracarboxylic acid derivative thereof (cf. Patent Document 2, for example); an aromatic oligomer typically a thiophene heximer such as α-thienyl and sexithiophene (cf. Patent Document 3, for example); and a conjugate polymer such as polythiophene, polythienylenevinylene and poly-p-phenylenevinylene (cf. Non-patent Documents 1 to 4). Therefore, development of a semiconductor composition using a new charge transfer material showing high carrier mobility has been desired.

In Japanese Patent Publication Open to Public Inspection (hereafter referred to as JP-A) No. 2003-292588, U. S. Patent Opened Application Nos. 2003/136,958, 2003/160,230 and 2003/164,495, described are that "When a polymer TFT is used as the logical element of integrated circuit to be used for microelectronics, the mechanical durability is largely improved and the life timed thereof is prolonged. However, it is considered that many semiconductive polythiophenes are instable when they are in contact with air since such the compounds are each oxidized by doping by atmospheric oxygen so that the electric conductivity is increased. As a result of that, the off-current in the device prepared from such the material is increased and the ON/OFF ration of the electric current is reduced. Therefore, it is necessary for many of these compounds to pay sever attention for preventing or minimizing the oxidation doping by removing oxygen in the environment in the course of the processing of the material and the device production. Attraction of the polymer TFT as the economical technology, specifically for large screen displays, for replacing the silicon TFT technology is reduced since such the preventing measure results in a higher cost. The above-mentioned and other shortcomings can be avoided or minimized in the embodiments of the invention. Accordingly, an electronic device having high resistivity against oxygen and relatively high ON/OFF current ratio is demanded." and proposed is a countermeasure for solving the problems. However, the level of the improvement has been insufficient and further improvement has been desired.

Furthermore, it has been disclosed that an electroconductive compound having repeating units each having a structure in which a 5-member ring including a sulfur atom is contained can be applied for the above objects (cf. Patent Document 4, for example). However, concrete example of the 5-member ring include sulfur atom other than thiophene ring is not disclosed and there is no description suggesting other structures. Consequently, the properties of the compounds of the present invention having a thiazole moiety when the compounds are applied for the above-described objects have been difficult. Though Patent Document 5 discloses organic semiconductor materials each having a thiazole ring, any compound having a partially connected thiazole structure is not described and the description regarding the molecular weight of the compound is unclear, and there is no description suggesting that the specific thiazole ring-containing structure disclosed in the present invention is necessary for improving the property as the organic semiconductor material.

Patent Document 1: Japanese Patent Publication Open to Public Inspection (hereafter referred to as JP-A) No. 5-55568

Patent Document 2: JP-A 5-190877

Patent Document 3: JP-A 8-264805

Patent Document 4: JP-A 2003-119255

Patent Document 5: JP-A 2004-282039

Non-patent Document 1: "Science" vol. 289, p. 599, 2000

Non-patent Document 2: "Nature" vol. 403, p. 521, 2000

Non-patent Document 3: "Advanced Material" No. 2, P. 99, 2002

DISCLOSURE OF THE INVENTION

An object of the present invention is to provide an organic semiconductor material having high carrier mobility and high storage ability, and to provide an organic transistor, a field effect transistor and a switching element employing the organic semiconductor material.

One of the aspects of the present invention is an organic semiconductor material comprising a compound having a substructure represented by the following formula:

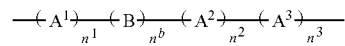

wherein, in the formula, B represents a unit having a thiazole ring, $A^1$ and $A^2$ each independently represent a unit having an alkyl group as a substituent, $A^3$ represents a divalent linking group, $n^b$ represents an integer of 1-20, $n^1$ and $n^2$ each independently represent an integer of 0-20, and $n^3$ represents an integer of 0-10.

DESCRIPTION OF THE PREFERRED EMBODIMENTS

Figure 1A:
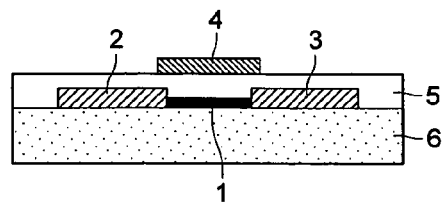
FIG. 1a shows a schematic constitution of an example of a field effect transistor using an organic semiconductor material.

The above object of the present invention is achieved by the following structures.

(1) An organic semiconductor material comprising a compound having a substructure represented by Formula (10):

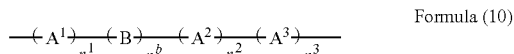

Formula (10)

wherein B represents a unit having a thiazole ring, $A^1$ and $A^2$ each independently represent a unit having an alkyl group as a substituent, $A^3$ represents a divalent linking group, $n^b$ represents an integer of 1-20, $n^1$ and $n^2$ each independently represent an integer of 0-20, and $n^3$ represents an integer of 0-10.

(2) The organic semiconductor material of Item (1), wherein, in Formula (10), B is represented by Formula (11):

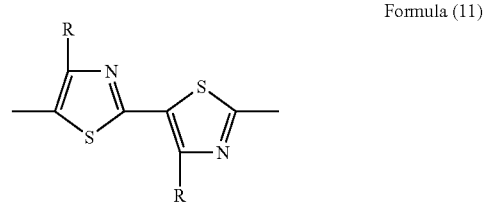

Formula (11)

wherein R represents a hydrogen atom or a substituent.

(3) The organic semiconductor material of Item (1), wherein, in Formula (10), B is represented by Formula (12):

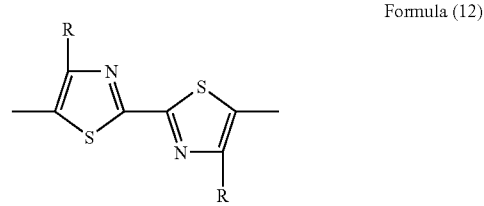

Formula (12)

wherein R represents a hydrogen atom or a substituent.

(4) The organic semiconductor material of Item (1), wherein, in Formula (10), B is represented by Formula (13):

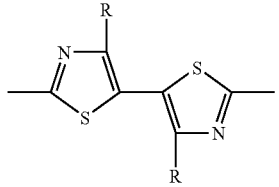

Formula (13)

wherein R represents a hydrogen atom or a substituent.

(5) The organic semiconductor material of Item (1), wherein, in Formula (10), B represents a unit having plurality of thiazole rings connected consecutively, and at least one of $n^1$, $n^2$ and $n^3$ is an integer of 1 or more.

(6) An organic transistor having the organic semiconductor of any one of Items (1) to (5) in an active layer.

(7) A field effect transistor comprising an organic charge transport material and a gate electrode directly or indirectly contacting with the organic charge transport material, a current in the organic charge transport material being controlled by a voltage applied between the gate electrode and the organic charge transport material, wherein the organic charge transport material is the organic semiconductor material of any one of Items (1) to (5).

(8) A switching element comprising the field effect transistor of Item (7).

(9) An organic semiconductor material comprising a compound having a thiazole moiety represented by Formula (1), (1-1), (1-2), (1-3), (1-4), (2), (2-1), (2-2), (2-3), (2-4), (3), (3-1), (3-2), (3-3), (3-4), (4), (4-1), (4-2), (4-3), or (4-4):

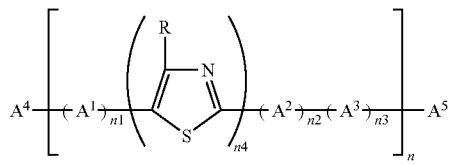

Formula (1)

wherein R represents a hydrogen atom or a substituent, $A^1$ and $A^2$ each independently represent a unit having an alkyl group as a substituent, $A^3$ represents a divalent linking group, $A^4$ and $A^5$ each represent a substituent, n represents an integer of 1-10, n1 and n2 each independently represent an integer of 0-20, n3 represents an integer of 0-10, and n4 represents an integer of 1-20,

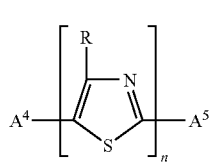

Formula (1-1)

wherein R represents a hydrogen atom or a substituent, $A^4$ and $A^5$ each independently represent a substituent, and n represents an integer of 1-10,

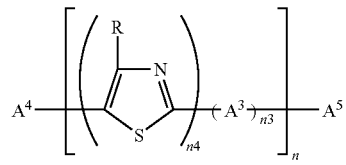

Formula (1-2)

wherein R represents a hydrogen atom or a substituent, $A^3$ represents a divalent linking group, $A^4$ and $A^5$ each represents a substituent, n represents an integer of 1-10, n3 represents an integer of 1-10, and n4 represents an integer of 1-20,

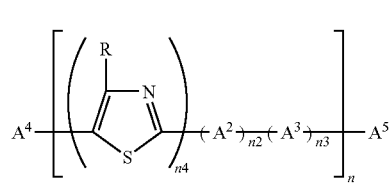

Formula (1-3)

wherein R represents a hydrogen atom or a substituent, $A^2$ represents a unit having an alkyl group as a substituent, $A^3$ represents a divalent linking group, $A^4$ and $A^5$ each represent a substituent, n represents an integer of 1-10, n2 represents an integer of 1-20, n3 represents an integer of 0-10, and n4 represents an integer of 1-20, Formula (1-4)

wherein R represents a hydrogen atom or a substituent, $A^1$ represents a unit having an alkyl group as a substituent, $A^3$ represents a divalent linking group, $A^4$ and $A^5$ each represent a substituent, n represents an integer of 1-10, n1 represents an integer of 1-20, n3 represents an integer of 0-10, and n4 represents an integer of 1-20,

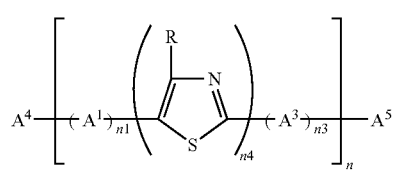

Formula (2)

wherein R represents a hydrogen atom or a substituent, $A^1$ and $A^2$ each independently represent a unit having an alkyl group as a substituent, $A^3$ represents a divalent linking group, $A^4$ and $A^5$ each represent a substituent, n represents an integer of 1-10, n1 and n2 each independently represent an integer of 0-20, n3 represents an integer of 0-10, and n5 represents an integer of 1-20,

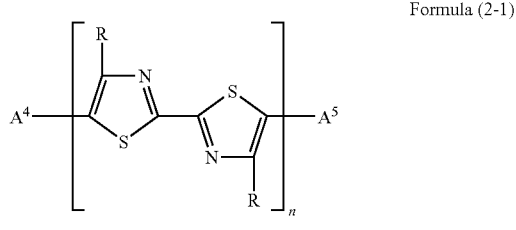

Formula (2-1)

wherein R represents a hydrogen atom or a substituent, $A^4$ and $A^5$ each represent a substituent, and n represents an integer of 1-10,

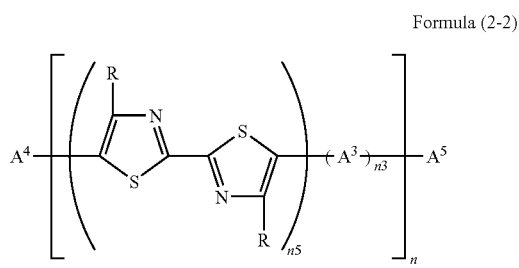

Formula (2-2)

wherein R represents a hydrogen atom or a substituent, $A^3$ represents a divalent linking group, $A^4$ and $A^5$ each represent a substituent, n represents an integer of 1-10, n3 represents an integer of 1-10, and n5 represents an integer of 1-20,

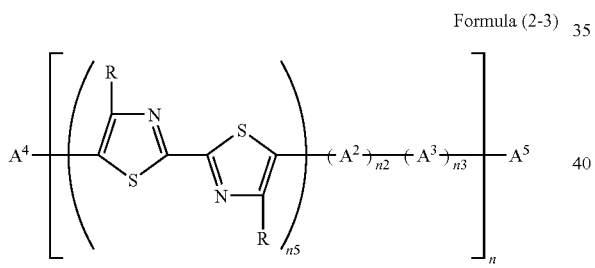

Formula (2-3)

wherein R represents a hydrogen atom or a substituent, $A^2$ represents a unit having an alkyl group as a substituent, $A^3$ represents a divalent linking group, $A^4$ and $A^5$ each represents a substituent, n represents an integer of 1-10, n2 represents an integer of 1-20, n3 represents an integer of 0-10, and n5 represents an integer of 1-20,

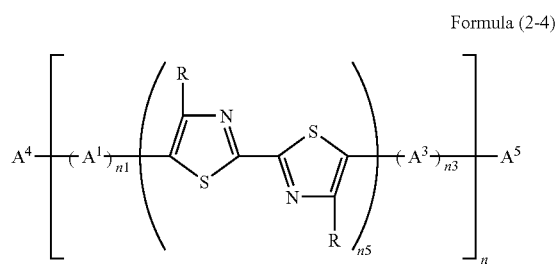

Formula (2-4)

wherein R represents a hydrogen atom or a substituent, $A^1$ and $A^2$ represent a unit having an alkyl group as a substituent, $A^4$ and $A^5$ each represent a substituent, n represents an integer of 1-10, n1 represents an integer of 1-20, n3 represent an integer of 0-10, and n5 represents an integer of 1-20,

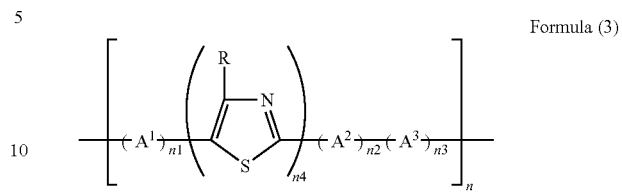

Formula (3)

wherein R represents a hydrogen atom or a substituent, $A^1$ and $A^2$ each independently represent a unit having an alkyl group as a substituent, $A^3$ represents a divalent linking group, n1 and n2 each independently represent an integer of 0-20, n3 represents an integer of 0-10, n4 represents an integer of 1-20, and n represents a number of repeating monomer segments or a degree of polymerization in a polymer,

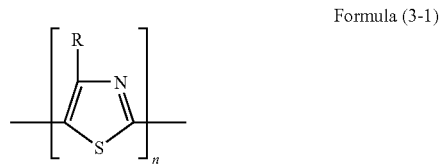

Formula (3-1)

wherein R represents a hydrogen atom or a substituent, and n represents a number of repeating monomer segments or a degree of polymerization in a polymer,

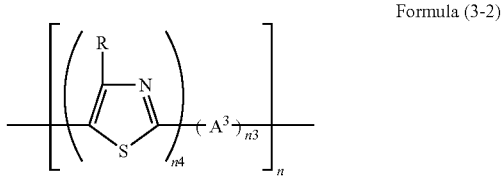

Formula (3-2)

wherein R represents a hydrogen atom or a substituent, $A^3$ represents a divalent linking group, n3 represents an integer of 1-10, n4 represents an integer of 1-20, and n represents a number of repeating monomer segments or a degree of polymerization in a polymer,

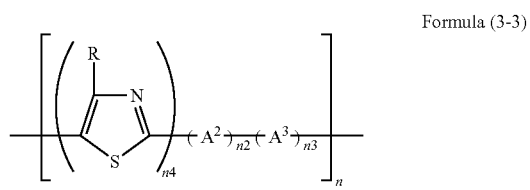

Formula (3-3)

wherein R represents a hydrogen atom or a substituent, $A^2$ represents a unit having an alkyl group as a substituent, $A^3$ represents a divalent linking group, n2 represents an integer of 1-20, n3 represents an integer of 0-10, n4 represents an integer of 1-20, and n represents a number of repeating monomer segments or degree of polymerization in a polymer, Formula (3-4)

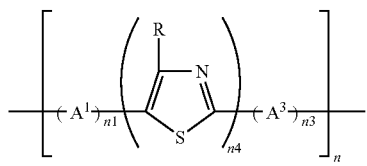

wherein R represents a hydrogen atom or a substituent, $A^1$ represents a unit having an alkyl group as a substituent, $A^3$ represents a divalent linking group, n1 represents an integer of 1-20, n3 represents an integer of 0-10, n4 represents an integer of 1-20, and n represents a number of repeating monomer segments or a degree of polymerization in a polymer, Formula (4)

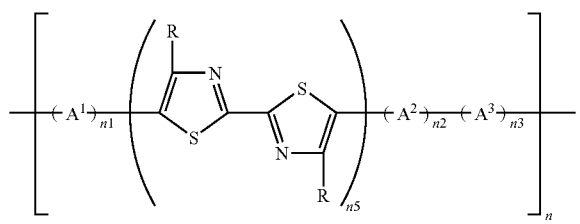

wherein R represents a hydrogen atom or a substituent, $A^1$ and $A^2$ each independently represent a unit having an alkyl group as a substituent, $A^3$ represents a divalent linking group, n1 and n2 each independently represent an integer of 0-20, n3 represents an integer of 0-10, n5 represents an integer of 1-20, and n represents a number of repeating monomer segments or a degree of polymerization in a polymer, Formula (4-1)

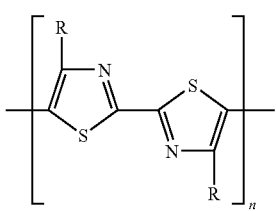

wherein, R represents a hydrogen atom or a substituent, and n represents a number of repeating monomer segments or a degree of polymerization in a polymer, Formula (4-2)

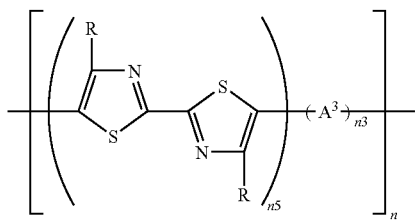

wherein R represents a hydrogen atom or a substituent, $A^3$ represents a divalent linking group, n3 represents an integer of 1-10, n5 represents an integer of 1-20, and n represents a number of repeating monomer segments or a degree of polymerization in a polymer, Formula (4-3)

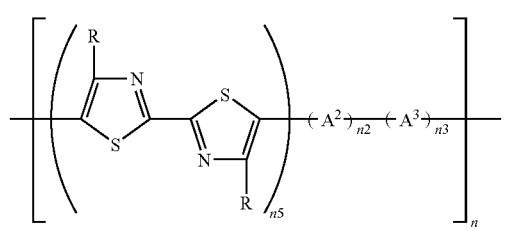

wherein R represents a hydrogen atom or a substituent, $A^2$ represents a unit having an alkyl group as a substituent, $A^3$ represents a divalent linking group, n2 represents an integer of 1-20, n3 represents an integer of 0-10, n5 represents an integer of 1-20, and n represents a number of repeating monomer segments or degree of polymerization in a polymer, Formula (4-4)

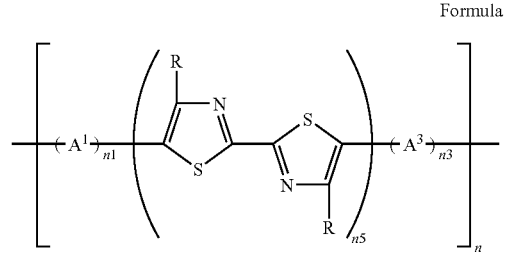

wherein R represents a hydrogen atom or a substituent, $A^1$ represents a unit having an alkyl group as a substituent, $A^3$ represents a divalent linking group, n1 represents an integer of 1-20, n3 represents an integer of 0-10, n5 represents an integer of 1-20, and n represents a number of repeating monomer segments or a degree of polymerization in a polymer.

(10) The organic semiconductor material of Item (9), wherein the compound having the thiazole moiety is a polymer.

(11) The organic semiconductor material of Item (9), wherein the compound having the thiazole moiety comprises an alkyl group or an alkoxy group as a substituent.

(12) The organic semiconductor material of Item (11), wherein the alkyl group is a straight chain alkyl group having 2-20 carbon atoms.

(13) The organic semiconductor material of any one of Items (9) to (11), wherein the compound having the thiazole moiety has an average molecular weight of 1000-200000.

The present invention will now be described further in detail.

In the above mentioned Formulae (1), (1-1), (1-2), (1-3), (1-4), (2), (2-1), (2-2), (2-3), (2-4), (3), (3-1), (3-2), (3-3), (3-4), (4), (4-1), (4-2), (4-3), (4-4), (10), (11), (12), and (13), R represents a hydrogen atom or a substituent.

Examples of a preferable substituent include: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl groupa and a pentadecyl group); cycloalkyl groups (for example, a cyclopentyl group and a cyclohexyl group); alkenyl groups (for example, a vinyl group and an allyl group); alkynyl groups (for example, an ethynyl group and a propargyl group); aryl groups (for example, a phenyl group and a naphthyl group); heteroaryl groups (for example, a furyl group, a thienyl group, a pyridyl group, a pyridazinyl group, and a pyrimidinyl group, a pyrazyl group, a triazinyl group, an imidazolyl group, a pyrazolyl group, a thiazolyl group, a benzimidazolyl group, a benzoxazolyl group, a quinazolyl group and a phthalazyl group); heterocycle groups (for example, a pyrrolidyl group, an imidazolysyl group, a morpholyl group and an oxazolidyl group); alkoxy groups (for example, a methoxy group, an ethoxy group, a propyloxy group, a pentyloxy group, a hexyloxy group, an octyloxy group, and a dodecyloxy group); cycloalkoxy groups for example, a cyclopentyloxy group and a cyclohexyloxy group); aryloxy groups (for example, a phenoxy group and a naphthyloxy group); alkylthio groups (for example, a methylthio group, an ethylthio group, a propylthio group, a pentylthio group, a hexylthio group, an octylthio group and a dodecylthio group); cycloalkylthio groups (for example, a cyclopentylthio group and a cyclohexylthio group); arylthio groups (For example, a phenylthio group and a naphthylthio group); alkoxycarbonyl groups (for example, a methyloxycarbonyl group, an ethyloxycarbonyl group, a butyloxycarbonyl group, an octyloxycarbonyl group and a dodecyloxycarbonyl group); aryloxycarbonyl group (for example, a phenyloxycarbonyl group and a naphthyloxycarbonyl group); sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group); acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); acyloxy groups (for example, an acetyloxy group, an ethylcarbonyloxy group, a butylcarbonyloxy group, an octylcarbonyloxy group, a dodecylcarbonyloxy group and a phenylcarbonyloxy group); amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecyl carbonylamino group, a phenylcarbonylamino group and a naphthylcarbonylamino group); carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group); ureido groups (for example, a methylureido group, an ethylureido group, a pentylureido group, a cyclohexylureido group, an octylureido group, a dodecylureido group, a phenylureido group, a naphthylureido group and a 2-pyridylaminoureido group); sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group); alkylsulfonyl groups (for example, a methylsulfonyl group, an ethylsulfonyl group, a butylsulfonyl group, a cyclohexylsulfonyl group, a 2-ethylhexylsulfonyl group and a dodecylsulfonyl group); arylsulfonyl groups (for example, a phenylsulfonyl group, a naphthylsulfonyl group and a 2-pyridylsulfonyl group); amino groups (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group); halogen atoms (for example, a fluorine atom, a chlorine atom and a bromine atom); fluorohydrocarbon groups (for example, a fluoromethyl group, a trifluoromethyl group, a pentafluoroethyl group and a pentafluorophenyl group); a cyano group; and silyl groups (for example, a trimethylsilyl group, a triisopropylsilyl group, a triphenylsilyl group and a phenyldiethylsilyl group). These substituents may further be substituted with an above mentioned substituent, and plurality of these substituents may be combined with each other to form a ring.

Examples of preferable substituents include: an alkyl group, a cycloalkyl group, an alkoxy group, an alkylthio group, an alkoxyalkyl group, an amino group substituted with an alkyl group, an alkylcarbamoyl group and an alkoxycarbonyl group. Specifically preferable is an alkyl group having not less than 5, but not more than 20 carbon atoms, or a straight chain alkoxy group having the same range of carbon atoms. Further more preferable is a straight chain alkyl group having not more than 10 carbon atoms.

In above mentioned Formulae (1), (1-3), (1-4), (2), (2-3), (2-4), (3), (3-3), (3-4), (4), (4-3), (4-4), and (10), $A^1$ and $A^2$ each independently represent a unit substituted with an alkyl group. The unit may further be substituted with above mentioned R. $A^3$ represents a divalent linking of which preferable examples include: alkylenes (methylene, ethylene, dialkylmethylene and propylene); arylenes (phenylene, biphenylene, phenanthrenylene, dihydrophenanthrenylene, fluorenylene and oligoarylene); dioxyalkylene; dioxyarylene; and oligoethyleneoxide.

Examples of $A^4$ and $A^5$ in above mentioned Formulae (1), (1-1), (1-2), (1-3), (1-4), (2), (2-1), (2-2), (2-3), and (2-4) include: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl groupa and a pentadecyl group); cycloalkyl groups (for example, a cyclopentyl group and a cyclohexyl group); aryl groups (for example, a phenyl group and a naphthyl group); heteroaryl groups (for example, a furyl group, a thienyl group, a pyridyl group, a pyridazinyl group, a pyrimidinyl group, a pyrazyl group, a triazinyl group, an imidazolyl group, a pyrazolyl group, a thiazolyl group, a benzimidazolyl group, a benzoxazolyl group, a quinazolyl group and a phthalazyl group). The aryl groups and the heteroaryl groups may further be substituted with above mentioned R.

Specific examples of above mentioned Formulae (1), (1-3), (1-2), (1-3), (1-4), (2), (2-1), (2-2), (2-3), (2-4), (3), (3-1), (3-2), (3-3), (3-4), (4), (4-1), (4-2), (4-3), (4-4), and (10) are shown below, however, the present invention is not limited thereto. The average molecular weight M of each of the polymers of the present invention is given together with each chemical structure. The average molecular weights were determined by Gel Permeation Chromatography using styrene as the reference.

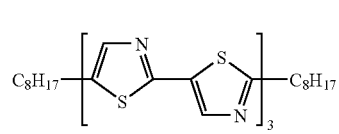 (1)
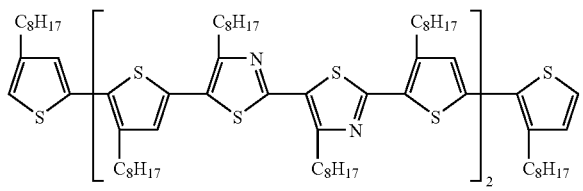 (2)
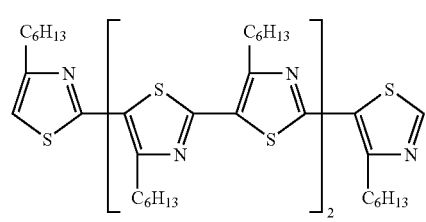 (3)
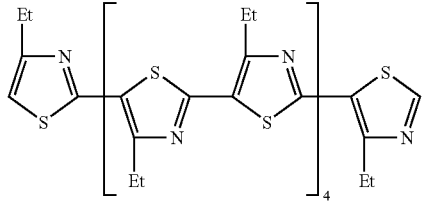 (4)
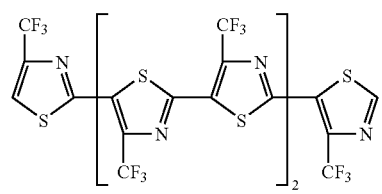 (5)
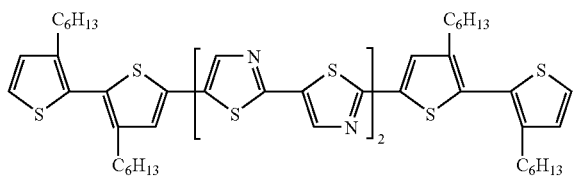 (6)
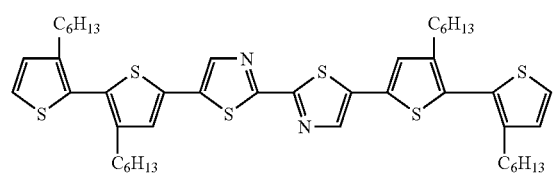 (7)
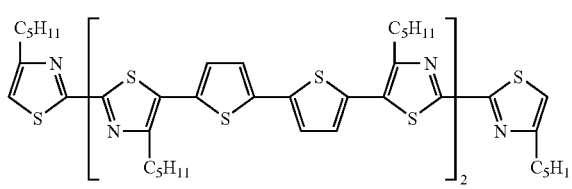 (8)
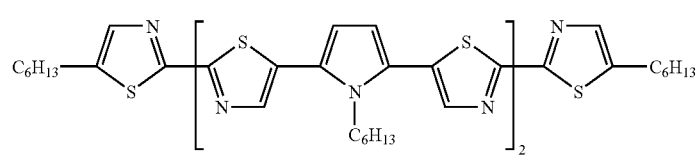 (9)
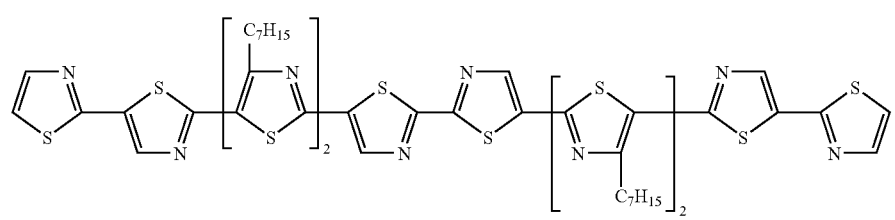 (10)
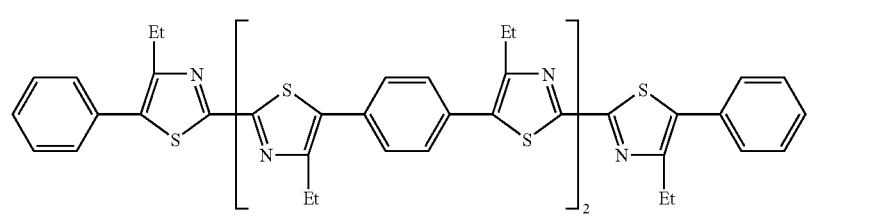 (11)

-continued
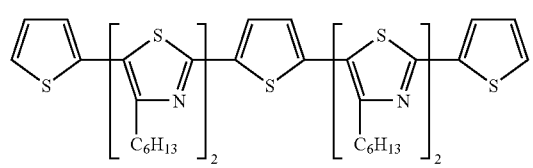
(12)
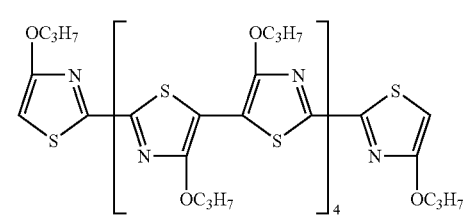
(13)
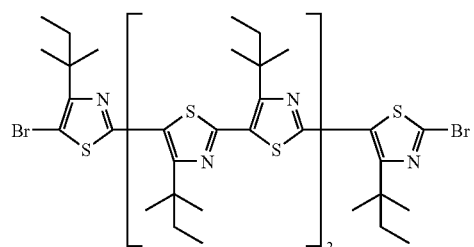
(14)
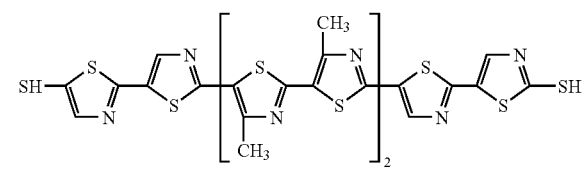
(15)
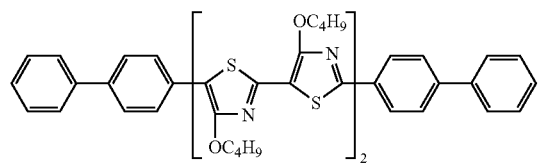
(16)
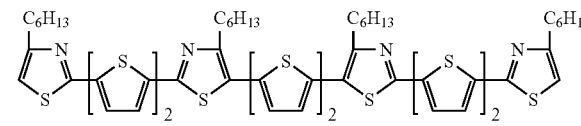
(17)
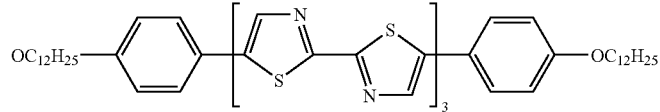
(18)
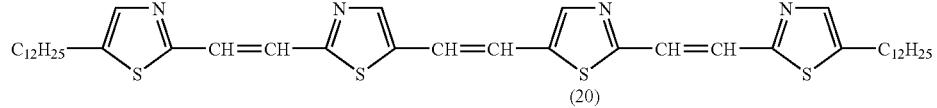
(19)
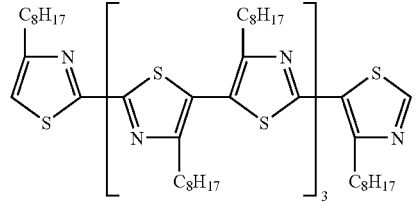
(20)
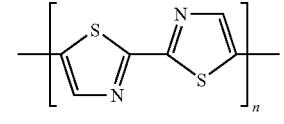
(21)
Average molecular weight: 20000
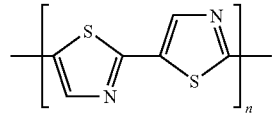
(22)
Average molecular weight: 36000
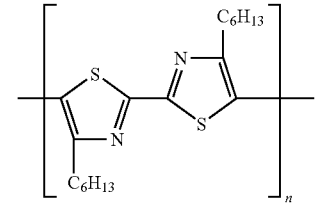
(23)
Average molecular weight: 42000
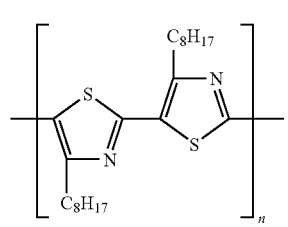
(24)
Average molecular weight: 80000
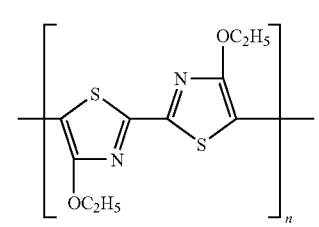
(25)
Average molecular weight: 55000

(26)
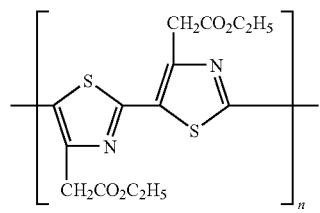
Average molecular weight: 8000
(27)
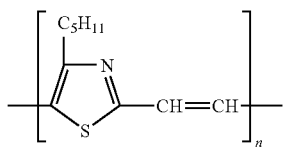
Average molecular weight: 28000
(28)
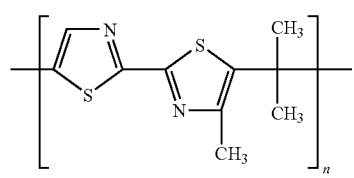
Average molecular weight: 59000
(29)
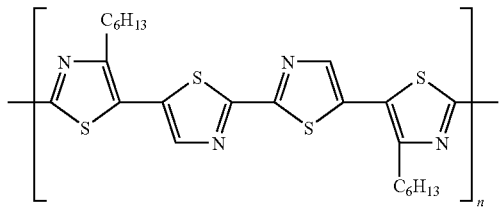
Average molecular weight: 62000
(30)
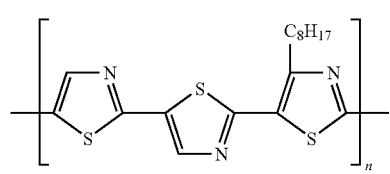
Average molecular weight: 33000
(31)
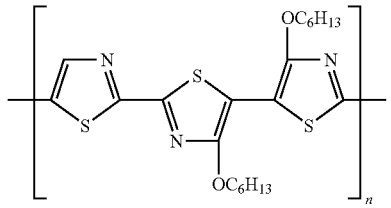
Average molecular weight: 25000
(32)
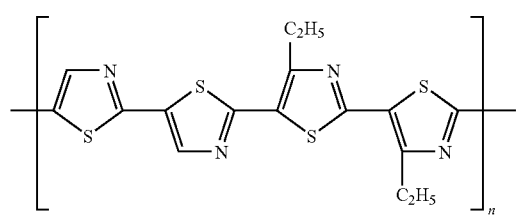
Average molecular weight: 97000
(33)
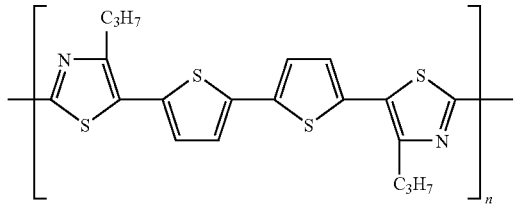
Average molecular weight: 38000
(34)
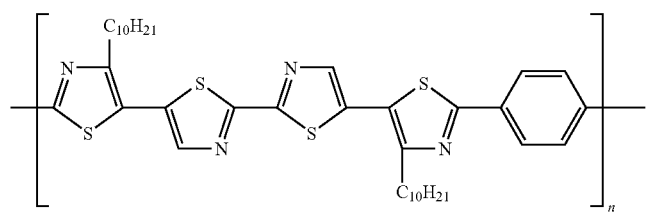
Average molecular weight: 60000
(35)
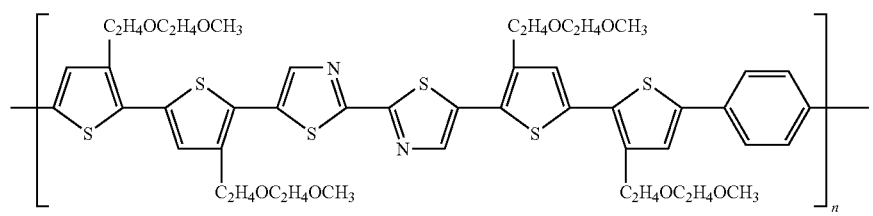
Average molecular weight: 22000

-continued
(36)
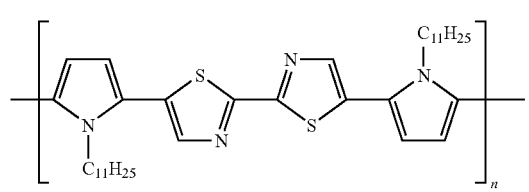
Average molecular weight: 120000
(37)
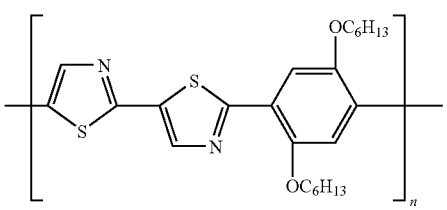
Average molecular weight: 76000
(38)
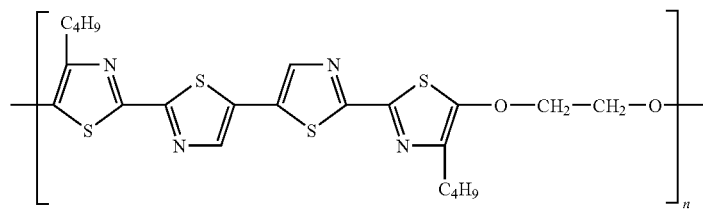
Average molecular weight: 12000
(39)
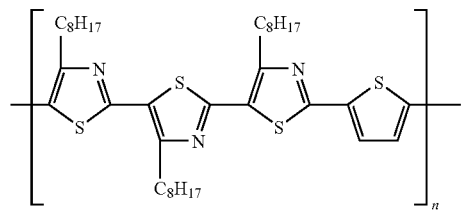
Average molecular weight: 24000
(40)
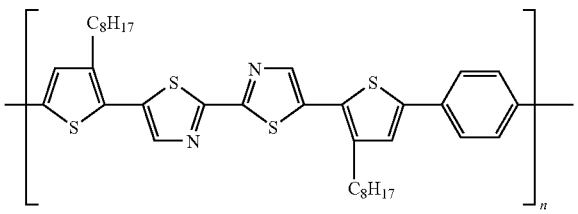
Average molecular weight: 78000
<41>
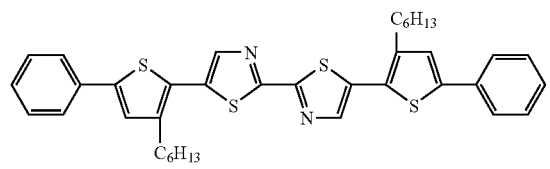
<42>
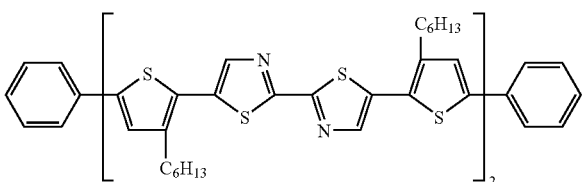
<43>
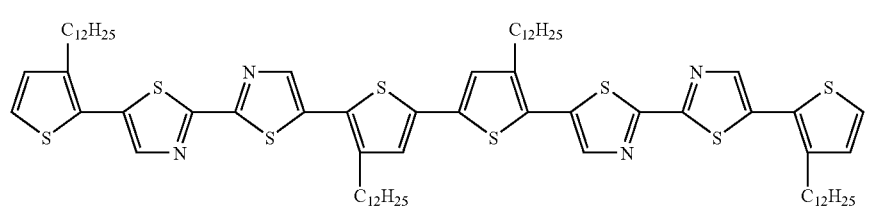
<44>
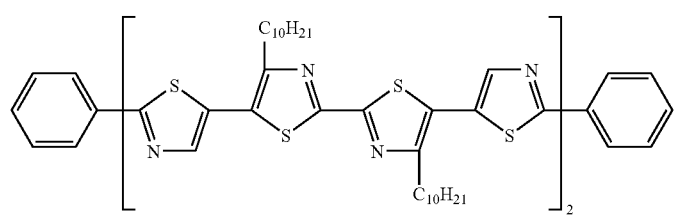
<45>
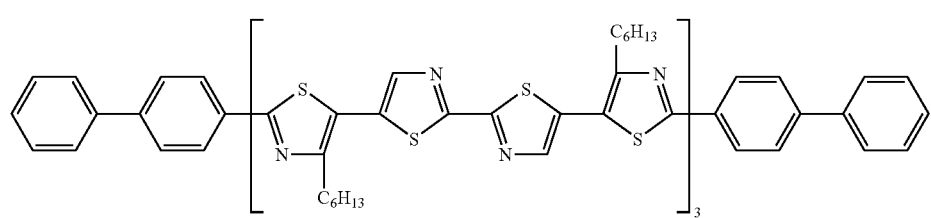

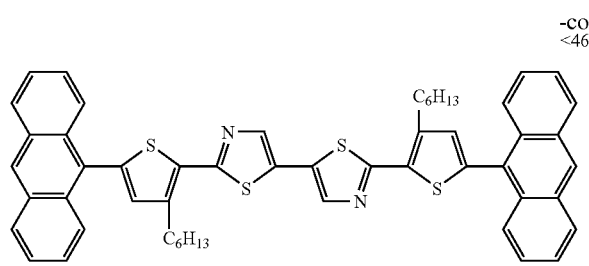
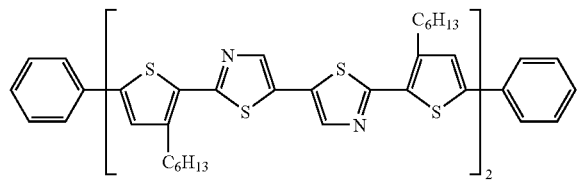
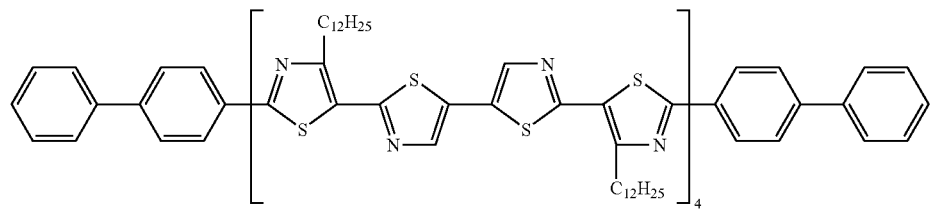
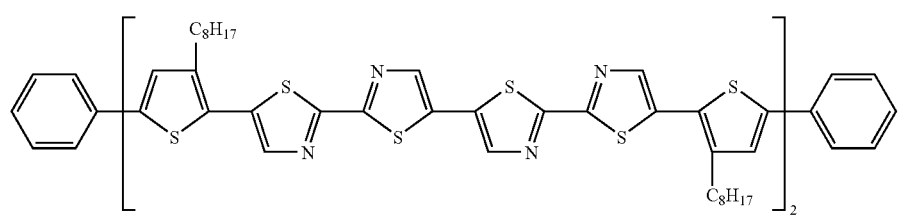
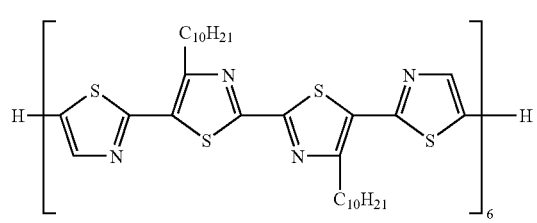
Synthesis examples of some concrete compounds are shown below, and the other compound can be similarly synthesized.
Synthesis Example 1
Synthesis of Compound 7
Synthesis Example 1
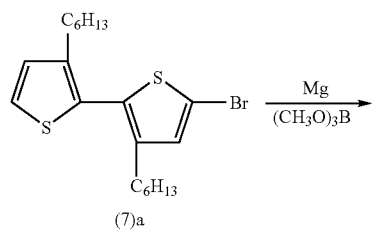
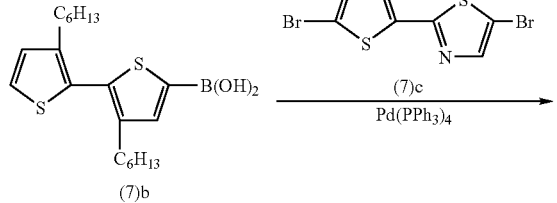
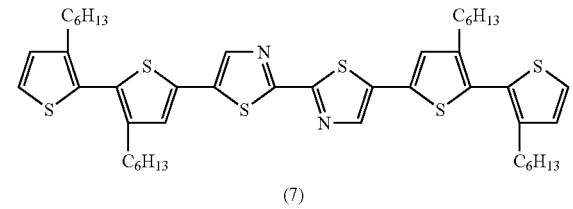
Synthesis of (7)b
Into a 200 ml three necked flask, 0.4 g (10 mmoles) of magnesium was put and air in the system was replaced with nitrogen, and 40 ml of tetrahydrofuran was further added.

And then 20 ml of a tetrahydrofuran solution of 4.1 g (10 mmoles) of Compound (7)a (Tetrahedron Lett. 37, 10, 1996, compound described in 1617-1620), was gradually dropped into the flask while stirring. The resultant mixture was stirred for 2 hours at room temperature and refluxed for 30 minutes. The reacting liquid was cooled to a temperature of not more than −70° C. and then a tetrahydrofuran solution of 2.1 g (20 mmoles) of trimethyl boronate was gradually dropped into the flask. After completion of the dropping, the mixture was stirred at the same temperature for 2 hours and further stirred at room temperature for 1 hour, and then 5.0 ml of concentrated hydrochloric acid was added and stirred for 30 minutes. The content was washed by a saturated sodium chloride solution, dried by magnesium sulfate and concentrated under reduce pressure by a rotary evaporator. The resultant residue was dispersed and washed by 50 ml of hexane and dried by blowing. Thus 3.0 g of white crystal were obtained. It was confirmed by 1H-NMR and mass spectrometry that the obtained substance was in accordance with the objective substance.

Synthesis of 7

Into a 100 ml of three necked flask, 0.3 g of tetrakis(triphenylphosphine)palladium (0) and 3.0 g (7.9 mmoles) of (7)b were added and air in the system was replaced with nitrogen. To the mixture, 30 ml of tetrahydrofuran was added and then 10 ml of tetrahydrofuran solution of 1 g (3.3 mmoles) of (7)c (J. Mater. Chem., 11, 5, 2001, compound described in 1357-1362) and 10 ml of 2 moles/L aqueous solution of sodium carbonate were added while stirring. The resultant mixture was heating and refluxed for 10 hours. After completion of the reaction, the reacting liquid was filtered by diatomite, and the filtrate was washed by a saturated sodium chloride solution, dried by magnesium sulfate and concentrated under reduced pressure by a rotary evaporator. The resultant residue was purified by a column chromatography to obtain 2.2 g of yellow crystals. It was confirmed by 1H-NMR and mass spectrogram that the obtained substance was in accordance with the objective substance.

Synthesis Example 2

Synthesis of Compound 23

Synthesis Example 2

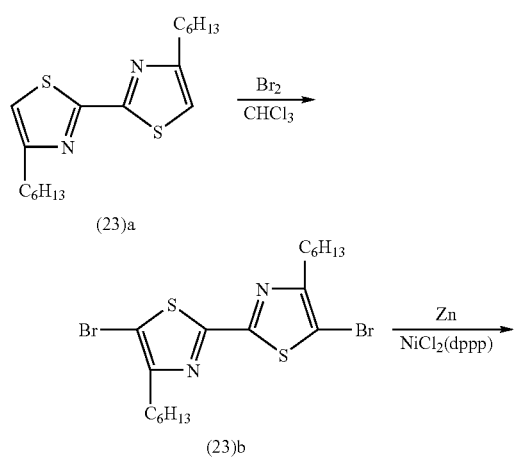

-continued

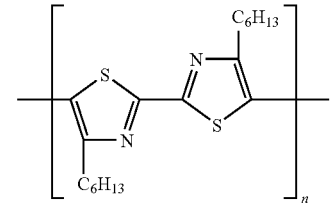

Average molecular weight: 42000

(23)

Synthesis of (23)b

Into a 200 ml three necked flask, 3.4 g (10 mmoles) of (23)a (Helv. Chim. Acta. 27, 1944, refer to 624) and 50 ml of chloroform were added and the reaction system was cooled to 5° C. or less, and then 3.2 g (20 mmoles) of bromine was gradually dropped. After completion of the dropping, the reaction liquid was stirred for 1 hour at room temperature, washed by a saturated sodium chloride solution, dried by magnesium sulfate and concentrated under reduced pressure by a rotary evaporator. The resultant residue was purified by a column chromatography to obtain 4.0 g of yellow solid substance. It was confirmed by 1H-NMR and mass spectrogram that the obtained substance was in accordance with the objective substance.

Synthesis of (23)

Under a nitrogen atmosphere, 20 ml of a tetrahydrofuran solution of 4.0 g (8.1 mmoles) of (23)b was dropped into 11.6 ml (8.8 mmoles) of Reike Zinc (manufactured by Sigma-Aldrich Co., 5 g/100 ml) while stirring and stirred for 1 hour at room temperature. After that, 30 ml of a tetrahydrofuran suspension of 0.05 g (0.1 mmoles) of 1,2-bis(dicyclohexylphosphino)-ethanenickel(II) chloride was gradually added, and then the reacting mixture was heated at 60° C. for 3 hours. Next, the reacting liquid was poured into a 2 moles/L methanol solution of hydrochloric acid. Thus formed precipitation was filtered and re-dissolved in heated tetrahydrofuran, and then poured into a 2 moles/L methanol solution of ammonia for conducting re-precipitation. Such the treatment was repeated twice and the precipitate was dried in vacuum for one night at room temperature. The molecular weight of thus obtained precipitate measure by GPC was 42,000 and the spectrum of the obtained substance was in accordance with that of the objective substance.

Synthesis Example 3

Synthesis of Compound (24)

Synthesis Example 3

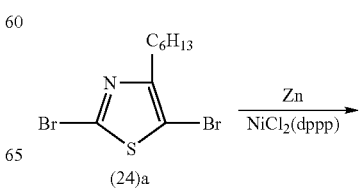

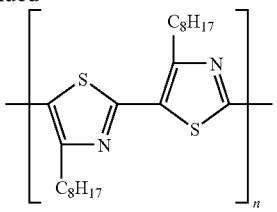

Average molecular weight: 80000

(24)

Synthesis of (24)

In nitrogen atmosphere, 20 ml of a tetrahydrofuran solution of 3.3 g of (24)a (refer to J. Chem. Soc. Perkin Trans 1, 1981, 2335-2339) was dropped into 14 ml (11 mmoles) of tetrahydrofuran solution of Reike Zinc (manufactured by Sigma-Aldrich Co., 5 g/100 ml) and stirred for 1 hour at room temperature. After that, 30 ml of a tetrahydrofuran suspension of 0.05 g (0.1 mmole) of 2-bis(dicyclohexylphosphino)ethanenickel(II) chloride was gradually added. The resultant mixture was heated at 60° C. for 3 hours and poured into a 2 moles/L methanol solution of hydrochloric acid. Thus formed precipitate was filtered and re-dissolved in heated tetrahydrofuran, and then poured into a 2 moles/L methanol solution of ammonia for re-precipitation. Such that the treatment was repeated twice, and the precipitation was dried under vacuum for one night at room temperature. The molecular weight of thus obtained precipitate measure by GPC was 80,000 and the spectrum of that was in accordance with the spectrum of the objective substance.

Synthesis Example 4

Synthesis of Compound 40

Synthesis Example 4

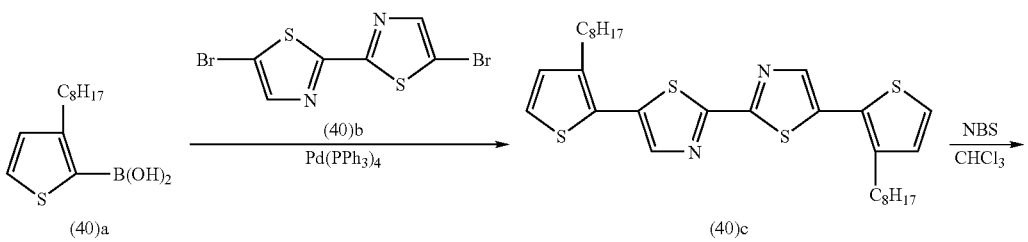

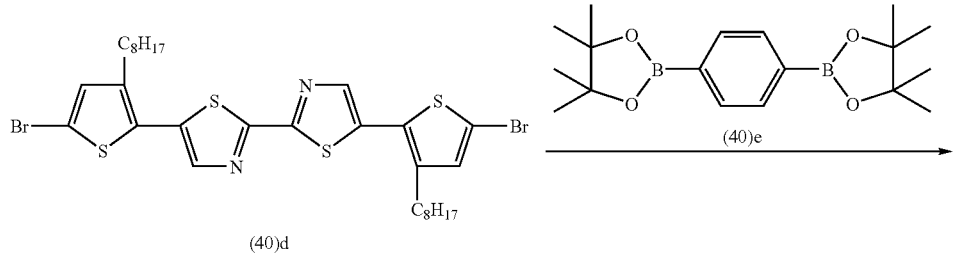

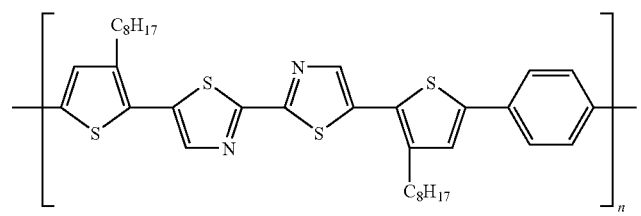

Average molecular weight: 78000

(40)

Synthesis of (40)c

Into a 200 ml tree necked flask, 0.5 g of tetrakis(triphenylphosphine)palladium(0) and 5.3 g (22 mmoles) of (40)a (Magn. Reson. Chem., 39, 2, 2001, compound described in 57-67) were added, air in the system was replaced with nitrogen and 50 ml of tetrahydrofuran was further added. Then, 20 ml of tetrahydrofuran solution of 3.3 g (10 mmoles) of (40)b (J. Mater. Chem., 11, 5, 2001, compound described in 1357-1363) was added while stirring, and heated and refluxed for 10 hours. After completion of reaction, the reacting liquid was filtered by diatomite at room temperature. The filtrate was washed by a saturated sodium chloride solution, dried by magnesium sulfate and concentrated by a rotary evaporator under a reduced pressure. The resultant residue was purified by column chromatography to obtain 4.3 g of yellow crystals. It was confirmed by 1H-NMR and mass spectrum that the obtained substance was in accordance with the objective substance.

Synthesis of (40)d

Into a 200 ml three necked flask, 4.3 g (7.7 mmoles) of (40)c and 50 ml of chloroform were added. The reacting system was cooled by 5° C. or less and 3.0 g (10 mmoles) of N-bromosuccinimide was added little by little. After the addition, the mixture was stirred for 1 hour, washed by a saturated sodium chloride solution, dried by magnesium sulfate and concentrated by a rotary evaporator under reduced pressure. The resultant residue was purified by column chromatography to obtain 4.5 g of solid substance. It was confirmed by 1H-NMR and mass spectrum that the obtained substance was in accordance with the objective substance.

Synthesis of (40)

In 50 ml of toluene, 4.5 g (6.3 mmoles) of (40)d and 2.1 g (6.3 mmoles) of (40)e were dissolved, and 0.14 g of tetrakis(triphenylphosphine)palladium, 20 ml of a toluene solution of 2.0 g of Aliquart 336 (Aldrich) and 20 ml of a 2 moles/L sodium carbonate solution were added under nitrogen atmosphere. The mixture was vigorously stirred and refluxed by heating for 48 hours. The viscous reacting liquid was poured into 500 ml of methanol for obtaining precipitation. The precipitation was took out by filtration and purified by a Soxhlet extractor using toluene, re-precipitated using methanol and dried at 60° C. for one night. The molecular weight of thus obtained precipitate measured by GPC was 78,000 and the spectral property thereof was in accordance with the structure of the objective substance.

The other compounds can be produced by a method similar to the above-described or a known method.

A suitably drivable transistor can be produced by providing the organic semiconductor of the present invention at an active layer of an organic thin film transistor element.

The organic thin film transistor is roughly classified into a top-gate type having a source electrode and a drain electrode connected with each other by an organic semiconductor channel (active layer) provided on a substrate and having a gate electrode through a gate isolation layer on the above-described electrodes; and a bottom-gate type having a gate electrode provided on the substrate and a source electrode and a drain electrode connected with each other by an organic semiconductor channel (active layer) provided on the gate electrode through a gate electrode isolation layer.

The compound of the present invention can be provided in the active layer of the organic thin film transistor element on the substrate by means of a vacuum deposition method, however, preferable is to form a solution in which the compound of the present invention and an additive if necessity are dissolved and to apply the solution on the substrate by means of, for example, a cast coating method, a spin coating method, a printing method, an ink-jet method or an ablation method. In such the case, the solvent for dissolving the compound of the present invention is not specifically limited as long as the solvent can dissolve the compound for preparing a solution having a suitable concentration. Concrete examples of the solvent include chain ether type solvents such as diethyl ether and di-isopropyl ether; cyclic ether type solvents such as tetrahydrofuran and dioxane; ketone type solvents such as acetone and methyl ethyl ketone; alkyl halide type solvents such as chloroform and 1,2-dichloroethane; aromatic solvents such as toluene, o-dichlorobenzene, nitrobenzene, m-cresol, N-methylpyrrolidone and carbon disulfide.

In the present invention, the material for constituting the source electrode, drain electrode and the gate electrode is not specifically limited. For example, platinum, gold, silver, nickel, chromium, copper, iron, tin, antimony, lead, tantalum, indium, palladium, tellurium, rhenium, iridium, aluminum, ruthenium, germanium, molybdenum, tin-antimony oxide, indium-tin oxide (ITO), fluorine-doped zinc oxide, zinc, carbon, graphite, glassy carbon, silver past and carbon past, lithium, beryllium, sodium, magnesium, potassium, calcium, scandium, titanium, manganese, zirconium, gallium, niobium, a sodium-potassium alloy, aluminum, a magnesium/copper mixture, a magnesium/silver mixture, a magnesium/aluminum mixture, a magnesium/indium mixture, an aluminum/aluminum oxide mixture and a lithium/aluminum mixture are usable. Of these, specifically preferable are, for example: platinum, gold, silver, copper, aluminum, indium, ITO and carbon. Furthermore, known electroconductive polymers which are raised in the electroconductivity by doping such as electroconductive polyaniline, electroconductive polypyrrole, electroconductive polythiophene and a complex of polyethylene dioxythiophene and polystyrenesulfonic acid are suitably usable.

For constituting the electrode, the following methods are applicable, for example: a method in which an electroconductive thin layer of the above described material formed by evaporation deposition or spattering is patterned to form the electrode by know photolithographic method and a lift-off method; and a method in which a resist pattern is formed by thermal transfer or ink-jet on a foil of metal such as aluminum or copper and the metal is etched. Furthermore, the electrode also may be formed by directly forming a pattern by applying a solution or dispersion of the electroconductive polymer or dispersion of electroconductive particles using an inkjet method; or by patterning an electroconductive polymer layer via a lithographic method or a laser ablation method. Moreover, applicable is a method in which the pattern of the electrode of an ink containing the electroconductive polymer or the electroconductive particles or an electroconductive past is formed by a printing method such as relief printing, intaglio printing, planographic printing and screen printing.

Various isolation layers can be used for the gate isolation layer, and an inorganic oxide layer having a high dielectric constant is particularly preferred. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate and yttrium trioxide. Among them, silicon oxide, aluminum oxide, tantalum oxide and titanium oxide are preferable. An inorganic nitride such as silicon nitride and aluminum nitride can be also suitably used.

For forming the isolation layer, various methods can be applied depending on the material, which include, for example, dry processes such as a vacuum deposition method, an ion cluster beam method, a low energy ion beam method, an ion plating method, a CVD method, a spattering method, and an atmospheric pressure plasma method; wet processes such as a spray coating method, a spin coating method, a blade coating method, a dip coating method, casting method, a roller coating method and a die coating method; and patterning methods such as a printing method and an ink-jet method.

In the wet process, a method in which a liquid prepared by dispersing the inorganic oxide particles in an optional organic solvent or water using a surfactant if necessary is coated and dried; and a method so called as a sol-gel method in which a solution of an oxide precursor such as an alkoxide is coated and dried; are applicable. Among the methods, preferable are the atmospheric pressure plasma method and the sol-gel method.

The isolation layer forming method by the atmospheric pressure plasma layer forming treatment is a treatment in which reactive gas plasma is excited by discharging under atmospheric or near atmospheric pressure to form a thin layer on the substrate. The method is described in JP-A Nos. 11-61406, 11-133205, 2000-121804, 2000-147209 and 2000-185362, hereinafter such the method is referred to as an atmospheric plasma method. A thin layer having high function can be formed with high production efficiency by such the method.

For the organic compound layer, applicable are, for example: photo-curable resins such as a polyimide, a polyamide, a polyester, a polyacrylate, a photo-radical polymerizing resin and a photo-cation polymerizable resin. Also applicable are, for example: a copolymer containing acrylonitrile component, a polyphenol, a polyvinyl alcohol, a novolac resin and cyanoethylpullulan. The wet process is preferable for the method for forming the organic compound layer. The inorganic oxide layer and the organic oxide layer can be used together. The thickness of the isolation layer is usually from 50 nm to 3 µm, and preferably from 100 nm to 1 µm.

The substrate is constituted by glass or a flexible resin sheet, and, for example, a plastic film can be used. Examples of the plastic film include films of polyethylene terephthalate (PET), polyethylene naphthalate (PEN), polyethersulfone (PES), polyetherimide, poly(ether ether ketone), poly(phenylene sulfide), polyallylate, polyimide, polycarbonate (PC), cellulose triacetate (TAC) and cellulose acetate propionate. The weight can be made lighter by the use of such the plastic film compared to the use of the glass plate so that the portability and the resistivity against shock of the element can be improved.

The field effect transistor using the organic thin layer containing the organic semiconductor material of the present invention is described below.

Figure 1B:
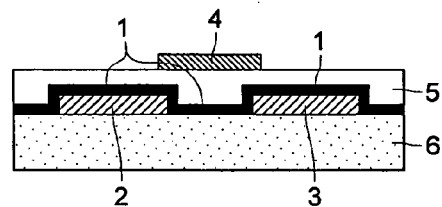
FIG. 1b shows a schematic constitution of an example of a field effect transistor using an organic semiconductor material.
Figure 1C:
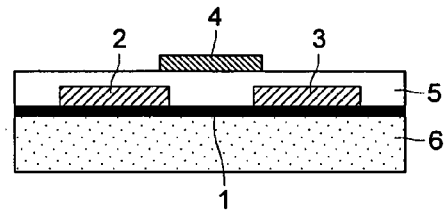
FIG. 1c shows a schematic constitution of an example of a field effect transistor using an organic semiconductor material.

FIGS. 1a to 1f show schematic structures of examples of field effect transistor using the organic semiconductor material of the present invention. FIG. 1a shows a field effect transistor which is constituted by providing a source electrode 2 and a drain electrode 3 are formed by a metal foil and forming a layer of the semiconductor material of the present invention 1 between these electrodes, and forming on them an isolating layer 5, and providing a gate electrode 4 on the isolation layer. FIG. 1b shows one the organic semiconductor material layer is formed by a coating method so as to cover the electrodes and the whole surface of the substrate; such the layer is formed between the electrodes in FIG. 1a. FIG. 1c shows one constituted by forming the organic semiconductor material layer by the coating method and then providing the source electrode 2, drain electrode 3, isolation layer 5 and gate electrode 4.

Figure 1D:
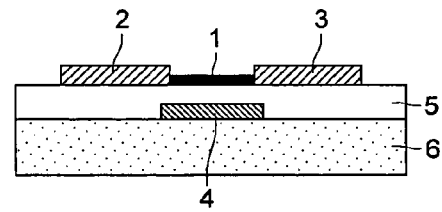
FIG. 1d shows a schematic constitution of an example of a field effect transistor using an organic semiconductor material.
Figure 1E:
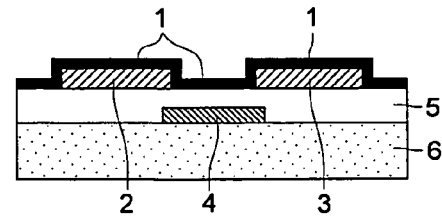
FIG. 1e shows a schematic constitution of an example of a field effect transistor using an organic semiconductor material.
Figure 1F:
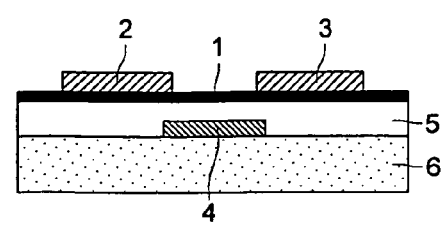
FIG. 1f shows a schematic constitution of an example of a field effect transistor using an organic semiconductor material.

FIG. 1d shows one constituted by providing the gate electrode 4 of metal foil on the substrate 6 and then forming the isolation layer 5, and providing the source electrode 2 and the drain electrode 3 and forming between them the organic semiconductor material layer 1 constituted by the organic semiconductor material of the present invention. Moreover, constitutions shown in FIGS. 1e and 1f are also available.

EXAMPLES

The present invention is described bellow referring examples but the embodiment of the present invention is not limited thereto.

Example 1

On a Si wafer having a relative resistivity of 0.01 Ω·cm which works as the gate electrode, a gate isolation layer of a thermal oxide film having a thickness of 2,000 angstroms was formed by heating, and then the surface was treated by octadecyltrichloro silane. A chloroform solution of Comparative Compound 1 (poly(3-hexylthiophene): Regioregular manufactured by Aldrich Co., Ltd., having an average molecular weight 89,000, PHT,) was coated by an applicator and naturally dried to form a cast layer having a thickness of 50 nm and subjected to a heating treatment at 50° C. for 30 minutes under nitrogen atmosphere. A source electrode and a drain electrode were formed on the thus prepared layer by evaporating gold using a mask. The source and drain electrodes each had a width of 100 µm, a thickness of 200 nm, a channel width of 3 mm and a channel length of 20 µm. Thus Organic Thin film transistor Element 1 was prepared.

Organic Thin film transistor Element 2 was prepared in the same manner as in Organic Thin film transistor Element 1 except that Comparative Compound 2 (pentacene prepared by purifying the product of Aldrich Co., Ltd.) was used in place of Comparative Compound 1.

Organic Thin film transistor Elements 3 through 8 were each prepared in the same manner as in Organic Thin film transistor Element 1 except that Comparative Compound 1 is replaced with the exemplified compounds of the present invention as shown in Table 1.

Organic Thin film transistor Elements 1 and 3 to 8 each exhibited suitable working properties as a p-channel enhancement mode FET. Moreover, the carrier mobility and the ON/OFF ratio (the ratio of drain currents when the gate bias was set to −50 V and 50 V while the drain bias was set to −50V) of each of Organic Thin film transistor Elements 1 through 8 were determined from the saturated area of the I-V characteristic. Further, the carrier mobility and the ON/OFF ratio of the elements were measured after standing for 1 month in air. Test results are shown in Table 1.

TABLE 1

| TFT element | Compound | Just after preparation | | After 1 month | | Remarks |
|---|---|---|---|---|---|---|
| | | Mobility (cm²/Vsec) | ON/OFF ratio | Mobility (cm²/Vsec) | ON/OFF ratio | |
| 1 | Comparative Compound 1 | $1.0 \times 10^{-2}$ | $1.2 \times 10^{3}$ | $2.0 \times 10^{-4}$ | $1.1 \times 10^{1}$ | Comp. |
| 2 | Comparative compound 2 | $3.2 \times 10^{-5}$ | $2.2 \times 10^{1}$ | Cannot be measured | Cannot be measured | Comp. |
| 3 | (2) | $2.1 \times 10^{-2}$ | $3.2 \times 10^{3}$ | $1.5 \times 10^{-2}$ | $2.4 \times 10^{3}$ | Inv. |
| 4 | (3) | $1.8 \times 10^{-2}$ | $3.9 \times 10^{3}$ | $1.0 \times 10^{-2}$ | $2.1 \times 10^{3}$ | Inv. |
| 5 | (7) | $2.8 \times 10^{-2}$ | $2.1 \times 10^{3}$ | $2.0 \times 10^{-2}$ | $1.5 \times 10^{3}$ | Inv. |
| 6 | (8) | $3.0 \times 10^{-2}$ | $4.6 \times 10^{3}$ | $2.4 \times 10^{-2}$ | $2.8 \times 10^{3}$ | Inv. |
| 7 | (13) | $2.0 \times 10^{-2}$ | $3.2 \times 10^{3}$ | $1.2 \times 10^{-2}$ | $1.3 \times 10^{3}$ | Inv. |
| 8 | (20) | $1.7 \times 10^{-2}$ | $4.0 \times 10^{3}$ | $1.5 \times 10^{-2}$ | $2.7 \times 10^{3}$ | Inv. |

Comp.: Comparative,
Inv.: Inventive

It is understood from Table 1 that the organic thin film transistor elements according to the present invention each show suitable properties as transistor and the deterioration accompanied with aging is suppressed. It is further understood that the organic thin film transistor element of the present invention shows suitable properties even when the thin layer is formed by the coating contrary to that the results of organic thin film transistor element 2 using Comparative Compound 2 (pentacene) clearly show that and pentacene layer functioning as the active layer cannot be obtained by coating method.

Example 2

Organic Thin film transistor Element 11 was prepared in the same manner as in Organic Thin film transistor Element 1 except that Comparative Compound 2 was replaced by Comparative Compound 3 (Exemplified Compound 3 of U. S. Patent Application Opened 2003/164495).

Organic Thin film transistor Elements 12 through 17 were prepared in the same manner as in organic thin film transistor element 1 except that the Comparative Compound 1 was replaced by the exemplified compounds of the present invention shown in Table 2.

Organic Thin film transistor Elements 11 through 17 each exhibited suitable working properties as a p-channel enhancement mode FET. Moreover, the carrier mobility and the ON/OFF ratio (the ratio of drain currents when the gate bias was set to −50 V and 50 V while the drain bias was set to −50V) of each of Organic Thin film transistor Elements 11 through 17 were determined from the saturated area of the I-V characteristic. Further, the carrier mobility and the ON/OFF ratio of the elements were measured after standing for 1 month in air. Test results are shown in Table 2.

TABLE 2

| TFT element | Compound | Just after preparation | | After 1 month | | Remarks |
|---|---|---|---|---|---|---|
| | | Mobility (cm²/Vsec) | ON/OFF ratio | Mobility (cm²/Vsec) | ON/OFF ratio | |
| 1 | Comparative Compound 1 | $1.0 \times 10^{-2}$ | $1.2 \times 10^{3}$ | $2.0 \times 10^{-4}$ | $1.1 \times 10^{1}$ | Comp. |
| 11 | Comparative compound 3 | $6.8 \times 10^{-3}$ | $4.2 \times 10^{5}$ | $1.5 \times 10^{-2}$ | $3.2 \times 10^{4}$ | Comp. |
| 12 | (23) | $6.7 \times 10^{-2}$ | $6.2 \times 10^{5}$ | $5.6 \times 10^{-2}$ | $5.7 \times 10^{5}$ | Inv. |
| 13 | (24) | $7.9 \times 10^{-2}$ | $4.9 \times 10^{5}$ | $6.2 \times 10^{-2}$ | $3.5 \times 10^{5}$ | Inv. |
| 14 | (29) | $9.1 \times 10^{-2}$ | $8.1 \times 10^{5}$ | $6.8 \times 10^{-2}$ | $6.2 \times 10^{5}$ | Inv. |
| 15 | (32) | $8.8 \times 10^{-2}$ | $7.3 \times 10^{5}$ | $7.5 \times 10^{-2}$ | $5.5 \times 10^{5}$ | Inv. |
| 16 | (34) | $7.2 \times 10^{-2}$ | $6.5 \times 10^{5}$ | $6.5 \times 10^{-2}$ | $6.2 \times 10^{5}$ | Inv. |
| 17 | (40) | $7.7 \times 10^{-2}$ | $6.2 \times 10^{5}$ | $6.2 \times 10^{-2}$ | $5.9 \times 10^{5}$ | Inv. |

Comp.: Comparative,
Inv.: Inventive

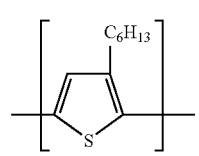

Comparative Compound 1

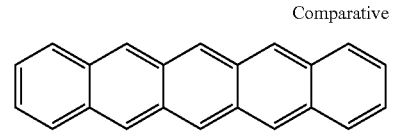

Comparative Compound 2

-continued

Comparative Compound 3

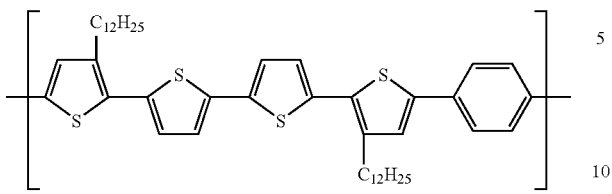

It is understood that the organic thin film transistor elements of the present invention are suitable in the properties as transistor and the deterioration accompanied with aging is inhibited.

Example 3

Organic Thin film transistor Elements 21 through 25 were prepared in the same manner as in Organic Thin film transistor Element 1 except that Comparative Compound 1 was replaced by the exemplified compounds of the present invention shown in Table 3. Results of evaluation performed in the same manner as in Example 1 are listed in Table 3.

TABLE 3

| TFT element | Compound | Just after preparation | | After 1 month | | Remarks |
|---|---|---|---|---|---|---|
| | | Mobility (cm²/Vsec) | ON/OFF ratio | Mobility (cm²/Vsec) | ON/OFF ratio | |
| 1 | Comparative Compound 1 | $1.0 \times 10^{-2}$ | $1.2 \times 10^{3}$ | $2.0 \times 10^{-4}$ | $1.1 \times 10^{1}$ | Comp. |
| 2 | Comparative compound 2 | $3.2 \times 10^{-5}$ | $2.2 \times 10^{1}$ | Cannot be measured | Cannot be measured | Comp. |
| 21 | 41 | $8.5 \times 10^{-2}$ | $3.5 \times 10^{4}$ | $6.1 \times 10^{-2}$ | $8.9 \times 10^{3}$ | Inv. |
| 22 | 42 | $1.8 \times 10^{-1}$ | $2.8 \times 10^{5}$ | $1.1 \times 10^{-1}$ | $9.9 \times 10^{4}$ | Inv. |
| 23 | 46 | $7.0 \times 10^{-2}$ | $1.5 \times 10^{5}$ | $5.8 \times 10^{-2}$ | $7.2 \times 10^{4}$ | Inv. |
| 24 | 47 | $2.0 \times 10^{-1}$ | $2.1 \times 10^{5}$ | $1.7 \times 10^{-1}$ | $1.2 \times 10^{5}$ | Inv. |
| 25 | 48 | $9.3 \times 10^{-2}$ | $6.5 \times 10^{4}$ | $5.5 \times 10^{-2}$ | $4.5 \times 10^{4}$ | Inv. |

Comp.: Comparative,
Inv.: Inventive

It is understood that the organic thin film transistor elements of the present invention is suitable in the properties as transistor.

PROBABILITY OF INDUSTRIAL APPLICATION

The organic semiconductor material having high carrier mobility and excellent anti-aging ability, the organic transistor, field effect transistor and switching element using the organic semiconductor material can be provided by the present invention. Furthermore, the ratio of the maximum current to the minimum current when the gate voltage is varied, namely, the ON/OFF ratio can be improved in the organic transistor according to the present invention.

What is claimed is:

1. An organic semiconductor material comprising a compound represented by Formula (10):

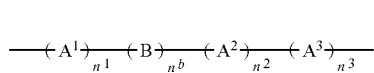

Formula (10)

wherein B represents a unit having an unsubstituted thiazole ring selected from the group consisting of Formula (11), Formula (12), and Formula (13),

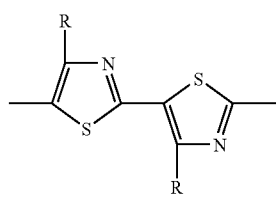

Formula (11)

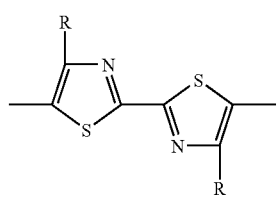

Formula (12)

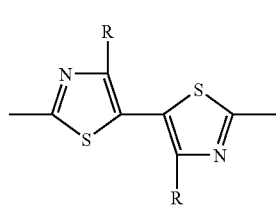

Formula (13)

wherein R represents a hydrogen atom, $A^1$ and $A^2$ each independently represent a divalent linking group having an alkyl group as a substituent, $A^3$ represents a divalent linking group, $n^b$ represents an integer of 1-20, $n^1$ and $n^2$ each independently represent an integer of 0-20, and $n^3$ represents an integer of 0-10, wherein at least one of $n^1$, $n^2$, and $n^3$ is an integer of 1 or more.

2. The organic semiconductor material of claim 1, wherein, in Formula (10), B represents a unit having plurality of thiazole rings connected consecutively, and at least one of $n^1$, $n^2$ and $n^3$ is an integer of 1 or more.

3. An organic transistor having the organic semiconductor of claim 1 in an active layer.

4. A field effect transistor comprising an organic charge transport material and a gate electrode directly or indirectly contacting with the organic charge transport material, a current in the organic charge transport material being controlled by a voltage applied between the gate electrode and the organic charge transport material, wherein the organic charge transport material is the organic semiconductor material of claim 1.

5. A switching element comprising the field effect transistor of claim 4.

6. An organic semiconductor material comprising a compound having a thiazole moiety represented by Formula (1), (1-2), (1-3), (1-4), (2), (2-2), (2-3), (2-4), (3), (3-2), (3-3), (3-4), (4), (4-2), (4-3), or (4-4):

Formula (1)

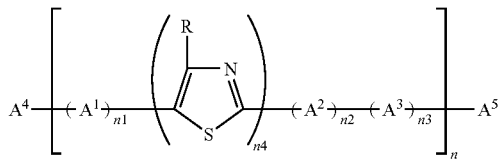

wherein R represents a hydrogen atom, $A^1$ and $A^2$ each independently represent a divalent linking group having an alkyl group as a substituent, $A^3$ represents a divalent linking group, $A^4$ and $A^5$ each represent a substituent, n represents an integer of 1-10, n1 and n2 each independently represent an integer of 0-20, n3 represents an integer of 0-10, and n4 represents an integer of 2-20, wherein at least one of n1, n2, n3 is an integer of 1 or more, Formula (1-2)

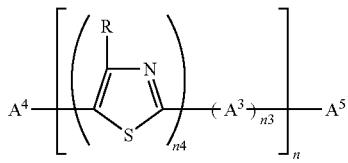

wherein R represents a hydrogen atom or a substituent, $A^3$ represents a divalent linking group, $A^4$ and $A^5$ each represent a substituent, n represents an integer of 1-10, n3 represents an integer of 1-10, and n4 represents an integer of 2-20, Formula (1-3)

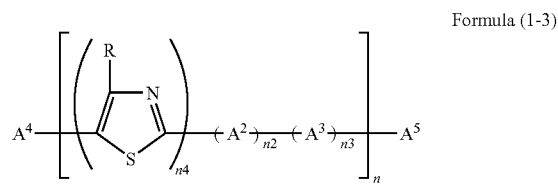

wherein R represents a hydrogen atom, $A^2$ represents a divalent linking group having an alkyl group as a substituent, $A^3$ represents a divalent linking group, $A^4$ and $A^5$ each represent a substituent, n represents an integer of 1-10, n2 represents an integer of 1-20, n3 represents an integer of 0-10, and n4 represents an integer of 2-20, Formula (1-4)

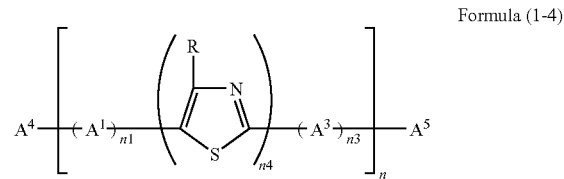

wherein R represents a hydrogen atom, $A^1$ represents a divalent linking group having an alkyl group as a substituent, $A^3$ represents a divalent linking group, $A^4$ and $A^5$ each represent a substituent, n represents an integer of 1-10, n1 represents an integer of 1-20, n3 represents an integer of 0-10, and n4 represents an integer of 2-20, Formula (2)

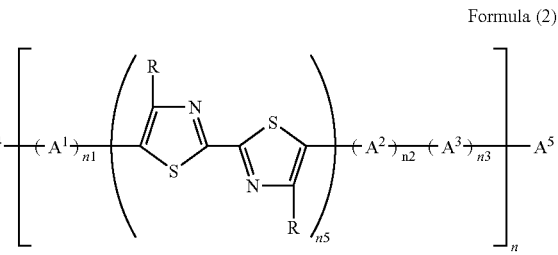

wherein R represents a hydrogen atom, $A^1$ and $A^2$ each independently represent a divalent linking group having an alkyl group as a substituent, $A^3$ represents a divalent linking group, $A^4$ and $A^5$ each represent a substituent, n represents an integer of 1-10, n1 and n2 each independently represent an integer of 0-20, n3 represents an integer of 0-10, and n5 represents an integer of 1-20, wherein at least one of n1, n2, and n3 is an integer of 1 or more, Formula (2-2)

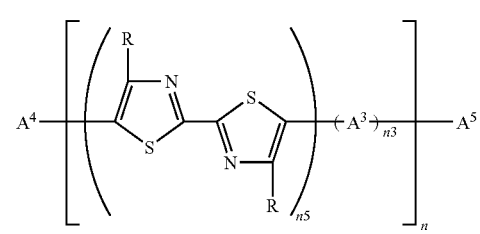

wherein represents a hydrogen atom or a substituent, $A^3$ represents a divalent linking group, $A^4$ and $A^5$ each represent a substituent, n represents an integer of 1-10, n3 represents an integer of 1-10, and n5 represents an integer of 1-20, Formula (2-3)

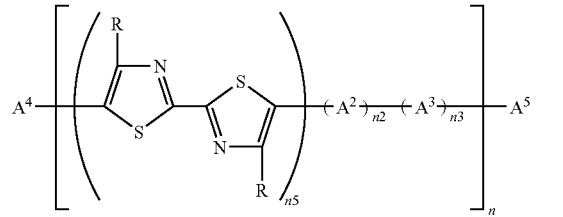

wherein R represents a hydrogen atom, $A^2$ represents a divalent linking group having an alkyl group as a substituent, $A^3$ represents a divalent linking group, $A^4$ and $A^5$ each represent a substituent, n represents an integer of 1-10, n2 represents an integer of 1-20, n3 represents an integer of 0-10, and n5 represents an integer of 1-20, Formula (2-4)

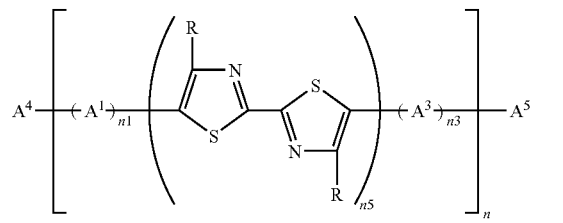

wherein R represents a hydrogen atom, $A^1$ and $A^3$ each represent a divalent linking group having an alkyl group as a substituent, $A^4$ and $A^5$ each represent a substituent, n represents an integer of 1-10, n1 represents an integer of 1-20, n3 represents an integer of 0-10, and n5 represents an integer of 1-20, Formula (3)

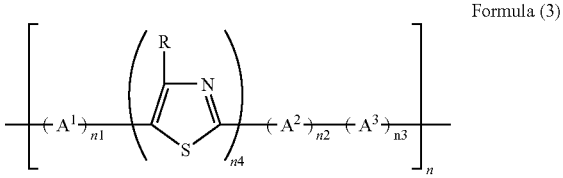

wherein R represents a hydrogen atom, $A^1$ and $A^2$ each independently represent a divalent linking group having an alkyl group as a substituent, $A^3$ represents a divalent linking group, n1 and n2 each independently represent an integer of 0-20, n3 represents an integer of 0-10, n4 represents an integer of 2-20, and n represents a number of repeating monomer segments or a degree of polymerization in a polymer, wherein at least one of n1, n2, and n3 is an integer of 1 or more, Formula (3-2)

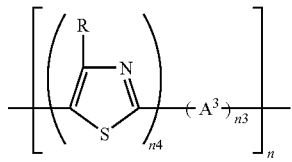

wherein R represents a hydrogen atom or a substituent, $A^3$ represents a divalent linking group, n3 represents an integer of 1-10, n4 represents an integer of 2-20, and n represents a number of repeating monomer segments or a degree of polymerization in a polymer, Formula (3-3)

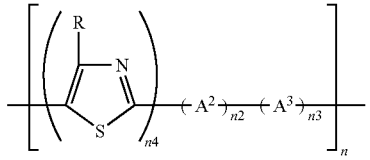

wherein R represents a hydrogen atom, $A^2$ represents a divalent linking group having an alkyl group as a substituent, $A^3$ represents a divalent linking group, n2 represents an integer of 1-20, n3 represents an integer of 0-10, n4 represents an integer of 2-20, and n represents a number of repeating monomer segments or a degree of polymerization in a polymer, Formula (3-4)

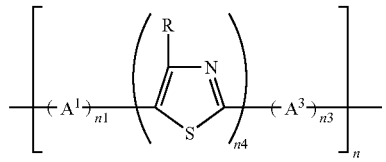

wherein R represents a hydrogen atom, $A^1$ represents a divalent linking group having an alkyl group as a substituent, $A^3$ represents a divalent linking group, n1 represents an integer of 1-20, n3 represents an integer of 0-10, n4 represents an integer of 2-20, and n represents a number of repeating monomer segments or a degree of polymerization in a polymer, Formula (4)

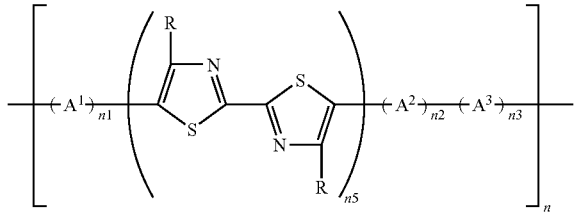

wherein R represents a hydrogen atom, $A^1$ and $A^2$ each independently represent a divalent linking group having an alkyl group as a substituent, $A^3$ represents a divalent linking group, n1 and n2 each independently represent an integer of 0-20, n3 represents an integer of 0-10, n5 represents an integer of 1-20, and n represents a number of repeating monomer segments or a degree of polymerization in a polymer, wherein at least one of n1, n2, and n3 is an integer of 1 or more,

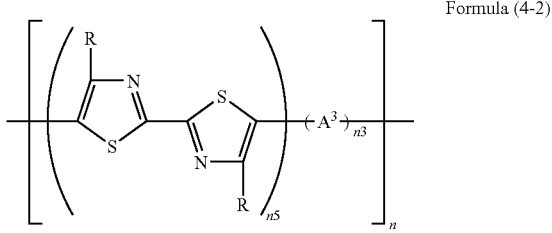

Formula (4-2)

wherein R represents a hydrogen atom or a substituent, $A^3$ represents a divalent linking group, n3 represents an integer of 1-10, n5 represents an integer of 1-20, and n represents a number of repeating monomer segments or a degree of polymerization in a polymer,

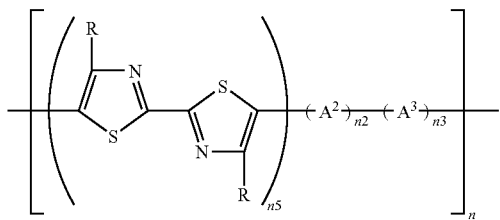

Formula (4-3)

wherein R represents a hydrogen atom, $A^2$ represents a divalent linking group having an alkyl group as a substituent, $A^3$ represents a divalent linking group, n2 represents an integer of 1-20, n3 represents an integer of 0-10, n5 represents an integer of 1-20, and n represents a number of repeating monomer segments or a degree of polymerization in a polymer,

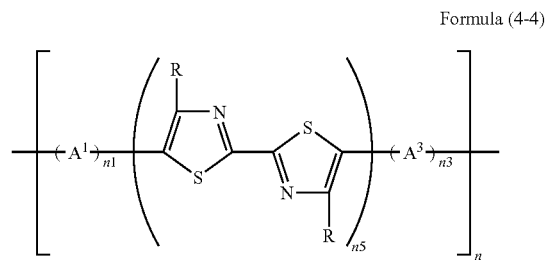

Formula (4-4)

wherein R represents a hydrogen atom, $A^1$ represents a divalent linking group having an alkyl group as a substituent, $A^3$ represents a divalent linking group, n1 represents an integer of 1-20, n3 represents an integer of 0-10, n5 represents an integer of 1-20, and n represents a number of repeating monomer segments or a degree of polymerization in a polymer.

7. The organic semiconductor material of claim 6, wherein the compound having the thiazole moiety is a polymer.

8. The organic semiconductor material of claim 6, wherein the compound having the thiazole moiety has an average molecular weight of 1000-200000.

* * * * *